United States Patent
Inui

(10) Patent No.: US 8,952,433 B2
(45) Date of Patent: Feb. 10, 2015

(54) SOLID-STATE IMAGE SENSOR, METHOD OF MANUFACTURING THE SAME, AND IMAGING SYSTEM

(75) Inventor: Fumihiro Inui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 285 days.

(21) Appl. No.: 13/288,155

(22) Filed: Nov. 3, 2011

(65) Prior Publication Data

US 2012/0119272 A1    May 17, 2012

(30) Foreign Application Priority Data

Nov. 16, 2010   (JP) ................................ 2010-256318
Oct. 3, 2011    (JP) ................................ 2011-219565

(51) Int. Cl.
*H01L 27/146*      (2006.01)
*H01L 31/18*       (2006.01)

(52) U.S. Cl.
CPC .... *H01L 27/14612* (2013.01); *H01L 27/14689* (2013.01)
USPC ........................................................ 257/292

(58) Field of Classification Search
USPC ........................................................ 257/292
See application file for complete search history.

(56) References Cited

U.S. PATENT DOCUMENTS

| | | | |
|---|---|---|---|
| 6,653,690 B1 * | 11/2003 | Kasai | 257/377 |
| 7,227,208 B2 | 6/2007 | Ogura et al. | |
| 7,345,346 B2 * | 3/2008 | Hoshizaki et al. | 257/368 |
| 7,411,170 B2 | 8/2008 | Shimotsusa et al. | 250/208.1 |
| 7,561,199 B2 | 7/2009 | Noda et al. | |
| 7,592,578 B2 | 9/2009 | Shimotsusa et al. | 250/208.1 |
| 7,692,226 B2 * | 4/2010 | Lee | 257/292 |
| 7,719,587 B2 | 5/2010 | Ogura et al. | |
| 7,920,192 B2 | 4/2011 | Watanabe et al. | |
| 8,546,852 B2 * | 10/2013 | Takagi | 257/213 |
| 2007/0012966 A1 | 1/2007 | Park | 257/291 |

(Continued)

FOREIGN PATENT DOCUMENTS

| | | |
|---|---|---|
| CN | 1195195 A | 10/1998 |
| EP | 1 884 997 A1 | 2/2008 |
| JP | 55044748 A * | 3/1980 |

(Continued)

OTHER PUBLICATIONS

Jul. 21, 2014 Chinese Office Action concerning corresponding Chinese Patent Application No. 201110363167.0.

*Primary Examiner* — Matthew W Such
*Assistant Examiner* — Robert Carpenter
(74) *Attorney, Agent, or Firm* — Fitzpatrick, Cella, Harper & Scinto

(57) ABSTRACT

A solid-state image sensor includes a pixel region and peripheral circuit region arranged on a semiconductor substrate. The pixel region includes pixels. Each pixel includes a photoelectric conversion element and an amplification MOS transistor that outputs a signal corresponding to charges of the photoelectric conversion element to a column signal line. The peripheral circuit region includes a circuit that drives the pixel or processes the signal output to the column signal line. A resistance of a source region of the amplification MOS transistor is lower than a resistance of a drain region of the amplification MOS transistor.

10 Claims, 11 Drawing Sheets

(56) References Cited

U.S. PATENT DOCUMENTS

| | | | |
|---|---|---|---|
| 2007/0108535 A1* | 5/2007 | Hoshizaki et al. | 257/382 |
| 2007/0145446 A1* | 6/2007 | Lee | 257/292 |
| 2009/0108298 A1* | 4/2009 | Takagi | 257/192 |
| 2009/0256937 A1 | 10/2009 | Noda et al. | |
| 2010/0109059 A1 | 5/2010 | Nakamura | 257/290 |

FOREIGN PATENT DOCUMENTS

| | | |
|---|---|---|
| JP | 9-326482 A | 12/1997 |
| JP | 2002-270807 A | 9/2002 |
| JP | 2008-41726 A | 2/2008 |
| JP | 2008-60356 | 3/2008 |
| WO | WO 2010/035144 A2 | 4/2010 |

* cited by examiner

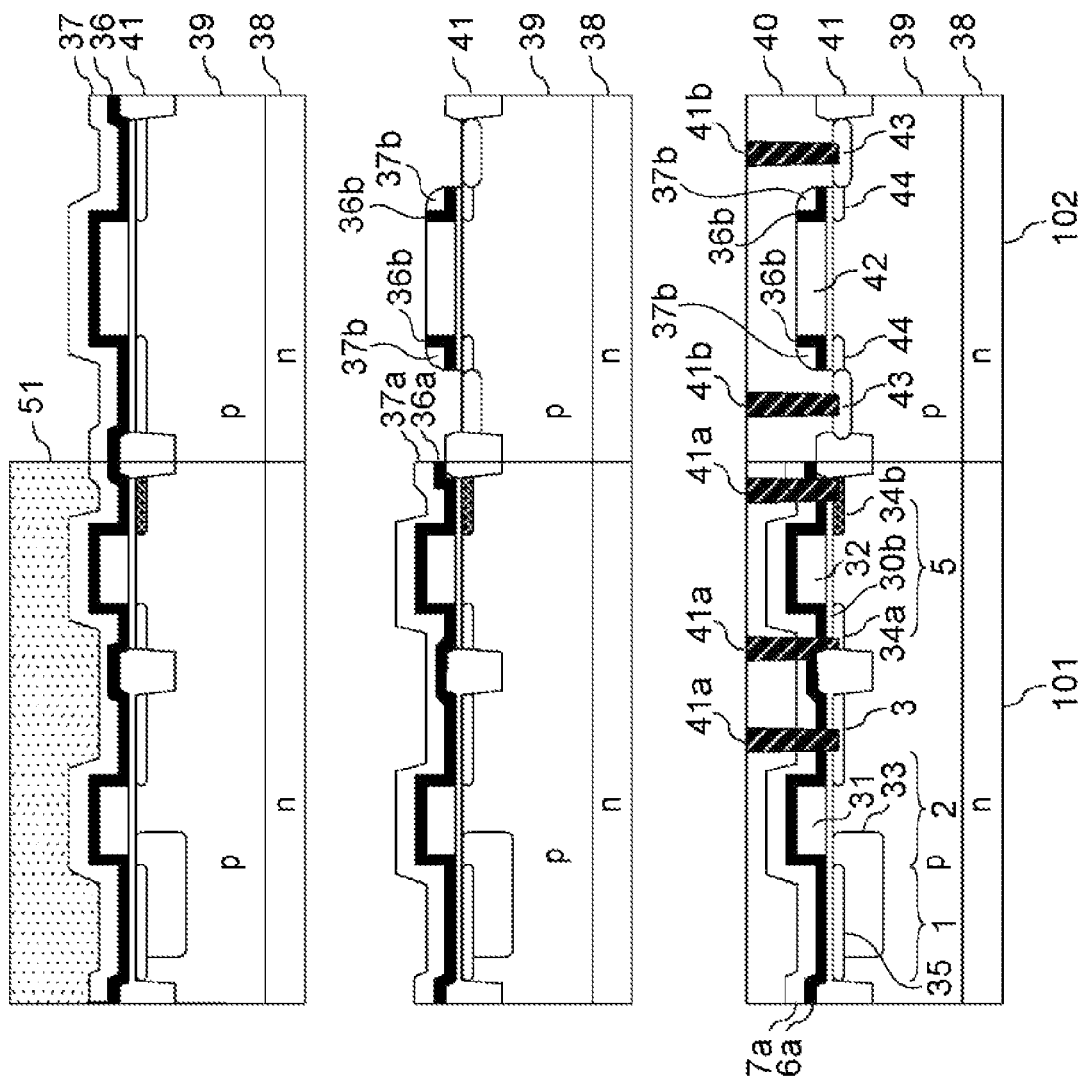

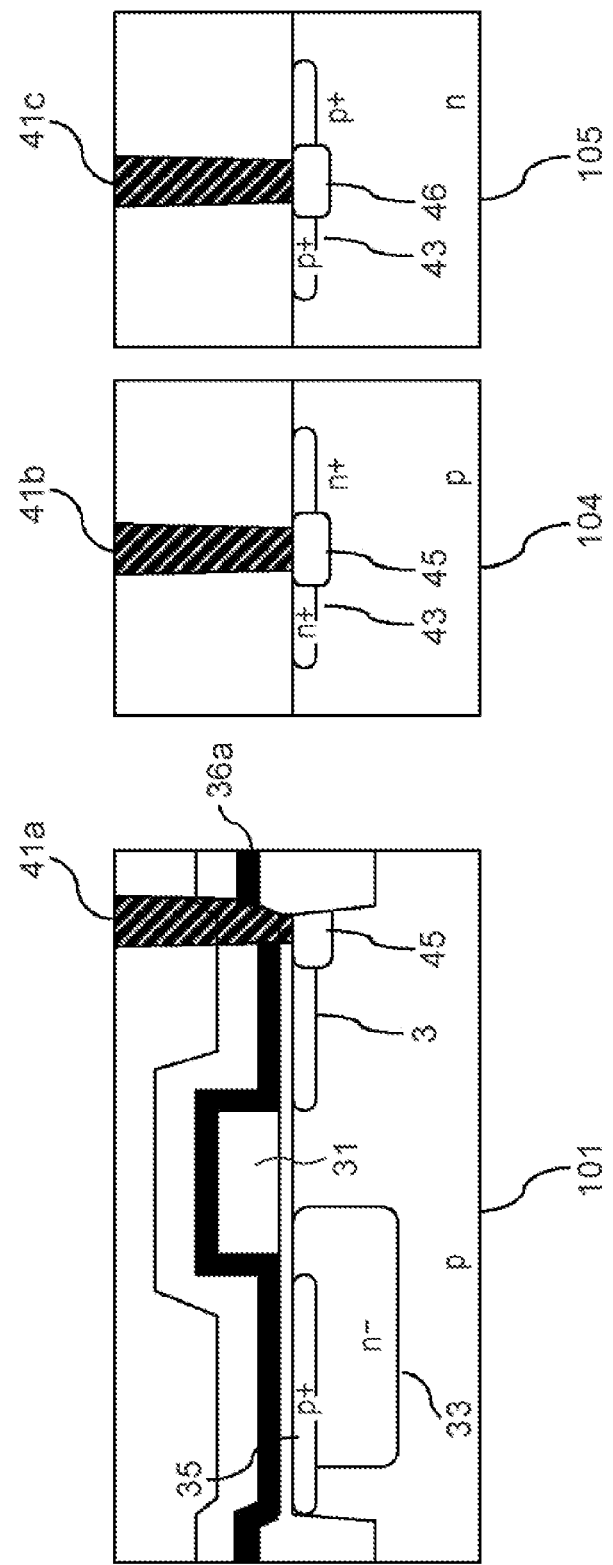

SOLID-STATE IMAGE SENSOR, METHOD OF MANUFACTURING THE SAME, AND IMAGING SYSTEM

BACKGROUND OF THE INVENTION

1. Field of the Invention

The present invention relates to a solid-state image sensor, a method of manufacturing the same, and an imaging system.

2. Description of the Related Art

As a solid-state image sensor, there exists a MOS solid-state image sensor including a pixel region and a peripheral circuit region. The pixel region includes a photoelectric conversion element and an amplification MOS transistor that outputs a signal corresponding to the charges of the photoelectric conversion element to a column signal line. The peripheral circuit region includes the pixel region and a circuit that drives the pixels or processes the signal output to the column signal line. One of the causes of noise generated in the MOS solid-state image sensor is the hot carrier generated in a MOS transistor. The hot carrier is generated by a strong electro field applied to a p-n junction formed from a drain region and a channel edge when a voltage is applied to the gate of the MOS transistor. In a device that handles a small signal, like the MOS solid-state image sensor, noise generated by the hot carrier can be especially problematic.

A noise reduction method disclosed in, for example, Japanese Patent Laid-Open No. 2008-41726 makes the impurity concentration of the source and drain regions of the MOS transistor in the pixel region lower than that in the peripheral circuit region. Also described is forming a peripheral MOS transistor having an LDD (Lightly Doped Drain) structure in the peripheral circuit region. This method allows the source and drain regions to form under conditions suitable for each of the pixel region and the peripheral circuit region. More specifically, since the field intensity is reduced in the channel and the drain region formed under the gate of the peripheral MOS transistor, the influence of the hot carrier can be reduced. In addition, since the MOS transistor in the pixel region does not have the LDD structure, the etching step of forming a sidewall spacer on the sidewall of the gate electrode in the pixel region is unnecessary. This makes it possible to reduce the influence of noise such as a dark current generated by etching damage. The drain region of the MOS transistor in the pixel region contains the impurity at a low concentration, although it does not have the LDD structure. For this reason, the influence of the hot carrier can be reduced even in the MOS transistor of the pixel region.

The recent solid-state image sensor is required to miniaturize the pixels and increase the number of pixels while maintaining or improving the photoelectric conversion characteristics such as the sensitivity and the dynamic range. To meet these requirements, it is effective to miniaturize regions other then the photoelectric conversion element in the pixel region while suppressing reduction of the photoelectric conversion element area.

However, miniaturizing the MOS transistor to read a signal based on the signal charges of the photoelectric conversion element arranged in the pixel region may degrade the driving capability of the MOS transistor. Especially when the impurity concentration of the source and drain regions of the MOS transistor in the pixel region is lowered to reduce the influence of the hot carrier, as described in Japanese Patent Laid-Open No. 2008-41726, the source resistance of the MOS transistor increases. For this reason, the driving capacity of the MOS transistor is low, leading to disadvantage in the high-speed read operation.

SUMMARY OF THE INVENTION

The present invention provides a technique advantageous in reducing noise and improving the driving capability of an amplification MOS transistor in the pixel region.

The first aspect of the present invention provides a solid-state image sensor comprising a pixel region and peripheral circuit region arranged on a semiconductor substrate, the pixel region including pixels each including a photoelectric conversion element and an amplification MOS transistor that outputs a signal corresponding to charges of the photoelectric conversion element to a column signal line, the peripheral circuit region including a circuit that drives the pixel or processes the signal output to the column signal line, wherein a resistance of a source region of the amplification MOS transistor is lower than a resistance of a drain region of the amplification MOS transistor.

The second aspect of the present invention provides a solid-state image sensor comprising a pixel region and peripheral circuit region arranged on a semiconductor substrate, the pixel region including pixels each including a photoelectric conversion element and an amplification MOS transistor that outputs a signal corresponding to charges of the photoelectric conversion element to a column signal line, the peripheral circuit region including a circuit that drives the pixel or processes the signal output to the column signal line, wherein an impurity concentration of a source region of the amplification MOS transistor is higher than an impurity concentration of a drain region of the amplification MOS transistor.

The third aspect of the present invention provides a solid-state image sensor comprising a pixel region and peripheral circuit region arranged on a semiconductor substrate, the pixel region including pixels each including a photoelectric conversion element and an amplification MOS transistor that outputs a signal corresponding to charges of the photoelectric conversion element to a column signal line, the peripheral circuit region including a circuit that drives the pixel or processes the signal output to the column signal line, wherein an interface between the source region and a channel region of the amplification MOS transistor is wider than an interface between the drain region and the channel region of the amplification MOS transistor.

The fourth aspect of the present invention provides a method of manufacturing a solid-state image sensor comprising a pixel region and peripheral circuit region arranged on a semiconductor substrate, the pixel region including pixels each including a photoelectric conversion element and an amplification MOS transistor that outputs a signal corresponding to charges of the photoelectric conversion element to a column signal line, the peripheral circuit region including a circuit that drives the pixel or processes the signal output to the column signal line, the manufacturing method comprising: a gate electrode formation step of forming a gate electrode of the amplification MOS transistor; a first implantation step of, using the gate electrode as a mask, implanting an impurity to a source formation region of the semiconductor substrate where a source of the amplification MOS transistor is to be formed and a drain formation region of the semiconductor substrate where a drain of the amplification MOS transistor is to be formed; and a second implantation step of selectively implanting an impurity to the source formation region from the source formation region and the drain formation region.

The fifth aspect of the present invention provides an imaging system comprising above solid-state image sensor; an optical system configured to form an image of light on the solid-state image sensor; and a signal processing circuit configured to process an output signal from the solid-state image sensor.

Further features of the present invention will become apparent from the following description of exemplary embodiments with reference to the attached drawings.

BRIEF DESCRIPTION OF THE DRAWINGS

FIGS. 6A to 6F are sectional views showing the procedure of the manufacturing process of the solid-state image sensor according to the first embodiment.

FIG. 7 is a schematic sectional view of a solid-state image sensor according to the third embodiment.

DESCRIPTION OF THE EMBODIMENTS

Figure 1:
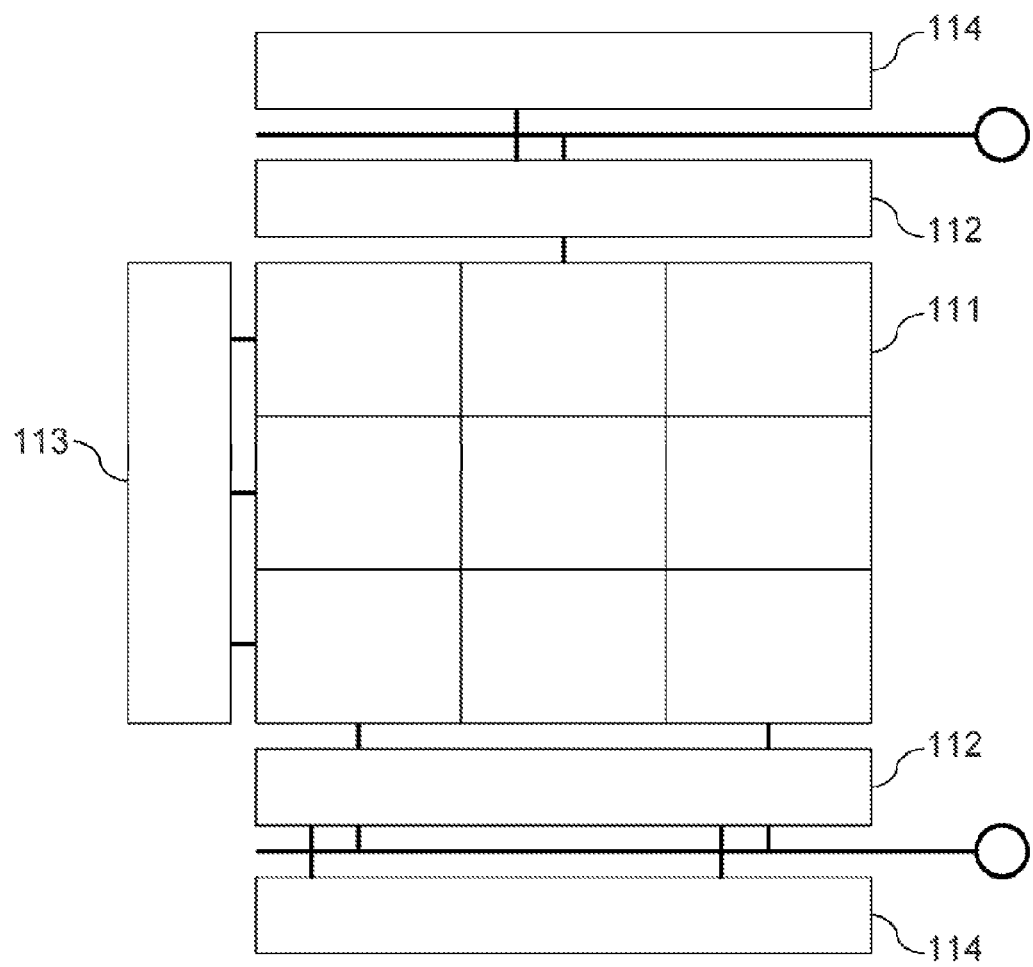
FIG. 1 is a schematic plan view of a solid-state image sensor according to an embodiment of the present invention.

Hereinafter, exemplary embodiments of the present invention are described by way of example referring to the drawings. Note that the present invention is not limited to the embodiments, and combinations or changes and modifications can be made without departing from the spirit and scope of the present invention. In the embodiments, a specific MOS transistor will be exemplified. However, the structure of each embodiment may be applied to every MOS transistor arranged in each region.

First Embodiment

FIG. 1 is a plan view showing the arrangement of a solid-state image sensor. Reference numeral 111 denotes a pixel region. When the solid-state image sensor is formed as a linear sensor, a plurality of pixels is one-dimensionally arrayed in the pixel region. When the solid-state image sensor is formed as an image sensor, a plurality of pixels is arrayed two-dimensionally, that is, to form a plurality of rows and a plurality of columns. The pixel is the minimum unit of an element aggregate including one photoelectric conversion element and elements to output a signal from the photoelectric conversion element to a column signal line. Examples of components that the element aggregate can include are a transfer unit, an amplification unit, and a reset unit. The transfer unit includes a transfer MOS transistor that transfers charges from the photoelectric conversion element to a floating diffusion unit. The amplification unit includes an amplification MOS transistor that outputs a signal converted into a voltage by the floating diffusion unit. The reset unit includes a reset MOS transistor that resets the voltage of the floating diffusion unit to a reset voltage. Adjacent pixels can share the amplification unit and the reset unit. In this case as well, the pixel is defined as the minimum unit of the element aggregate to read the signal of one photoelectric conversion element.

A signal processing circuit 112 includes a circuit that amplifies the signal read from the pixel region 111. In addition to the amplification circuit, the signal processing circuit 112 may include, for example, a circuit that reduces noise generated in the pixel by CDS (Correlated Double Sampling) processing. The signal processing circuit 112 may include a circuit configured to simply convert signals parallelly read from a plurality of columns into a serial signal.

A vertical shift register 113 is configured to drive the pixels arranged in the pixel region 111. A horizontal shift register 114 is configured to drive the signal processing circuit 112. To perform A/D conversion in the solid-state image sensor, an A/D conversion circuit may be included in it. The signal processing circuit 112, the vertical shift register 113, and the horizontal shift register 114 are arranged in the peripheral circuit region.

Figure 4:
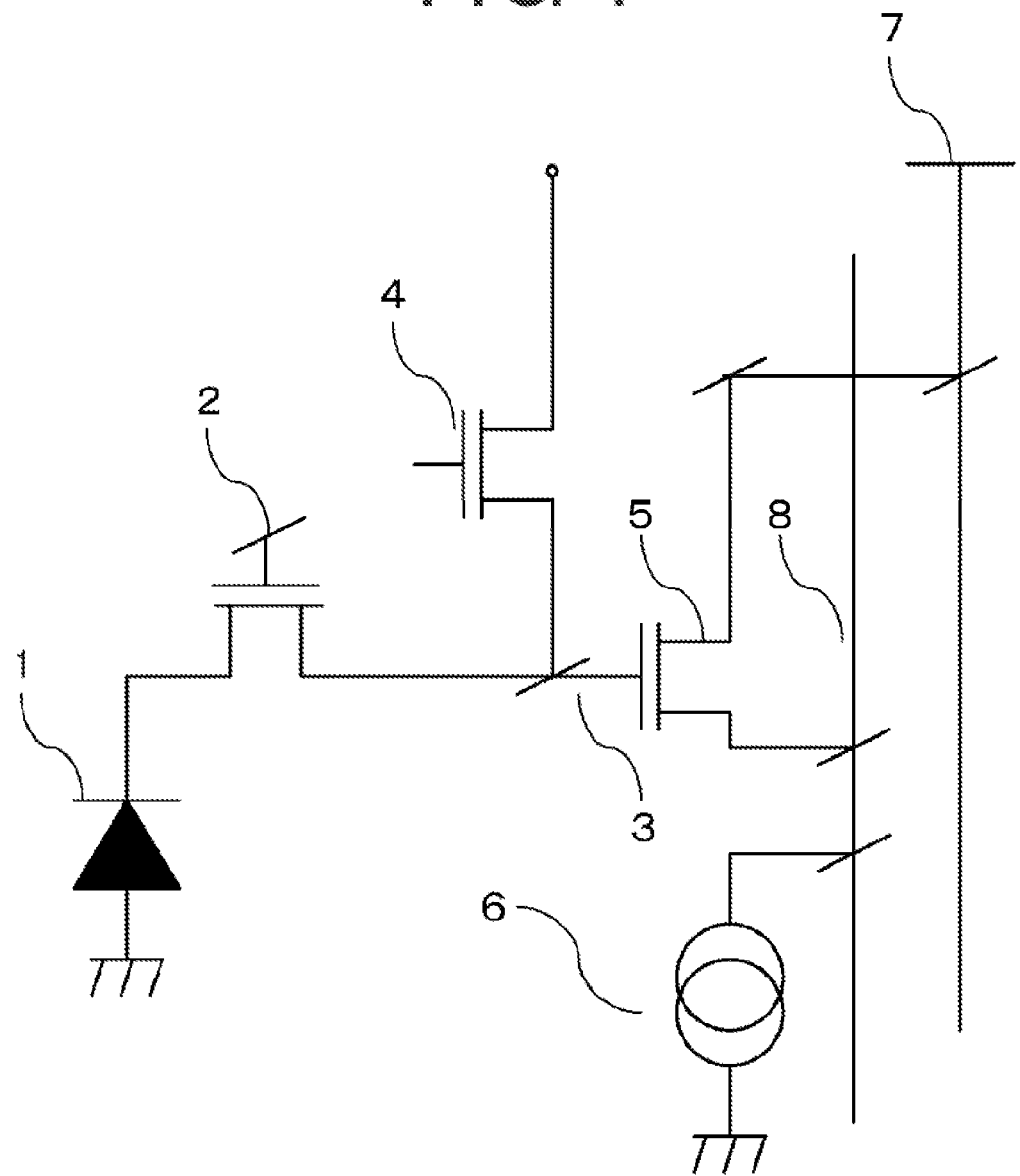
FIG. 4 is a circuit diagram of a pixel of the solid-state image sensor according to the embodiment of the present invention.

FIG. 4 shows an example of one pixel arrayed in the pixel region 111. The pixel includes, for example, a photoelectric conversion element 1, a transfer MOS transistor (transfer unit) 2, a reset MOS transistor (reset unit) 4, and an amplification MOS transistor (amplification unit) 5. The pixel can be selected by a voltage supplied to the drain of the reset MOS transistor 4. This selection is done by the vertical shift register. The photoelectric conversion element 1 formed from, for example, a photodiode converts incident light into charges and stores them. The transfer MOS transistor 2 transfers the charges stored in the photoelectric conversion element 1 to a floating diffusion (floating diffusion region: FD) 3 serving as the input portion of the amplification MOS transistor. The amplification MOS transistor 5, a constant current source 6, a power supply 7, and a column signal line 8 can constitute a source follower circuit. The amplification MOS transistor 5 can output the potential of the floating diffusion 3 to the column signal line 8 by the source follower operation. The charges are amplified and output by such a source follower operation. In this example, the target pixel to be read-accessed is selected by the drain voltage of the reset MOS transistor 4. However, a selecting MOS transistor may be provided to perform the selection. The selecting MOS transistor is arranged in the electrical path between the column signal line 8 and the source of the amplification MOS transistor 5. Alternatively, the selecting MOS transistor is arranged in the electrical path between the power supply 7 and the drain of the amplification MOS transistor 5.

For understanding the present invention, a solid-state image sensor will be explained in which the impurity concentration of the source and drain regions of the MOS transistor in the pixel region is made lower than that in the peripheral circuit region, and a peripheral MOS transistor has an LDD structure.

Figure 8:
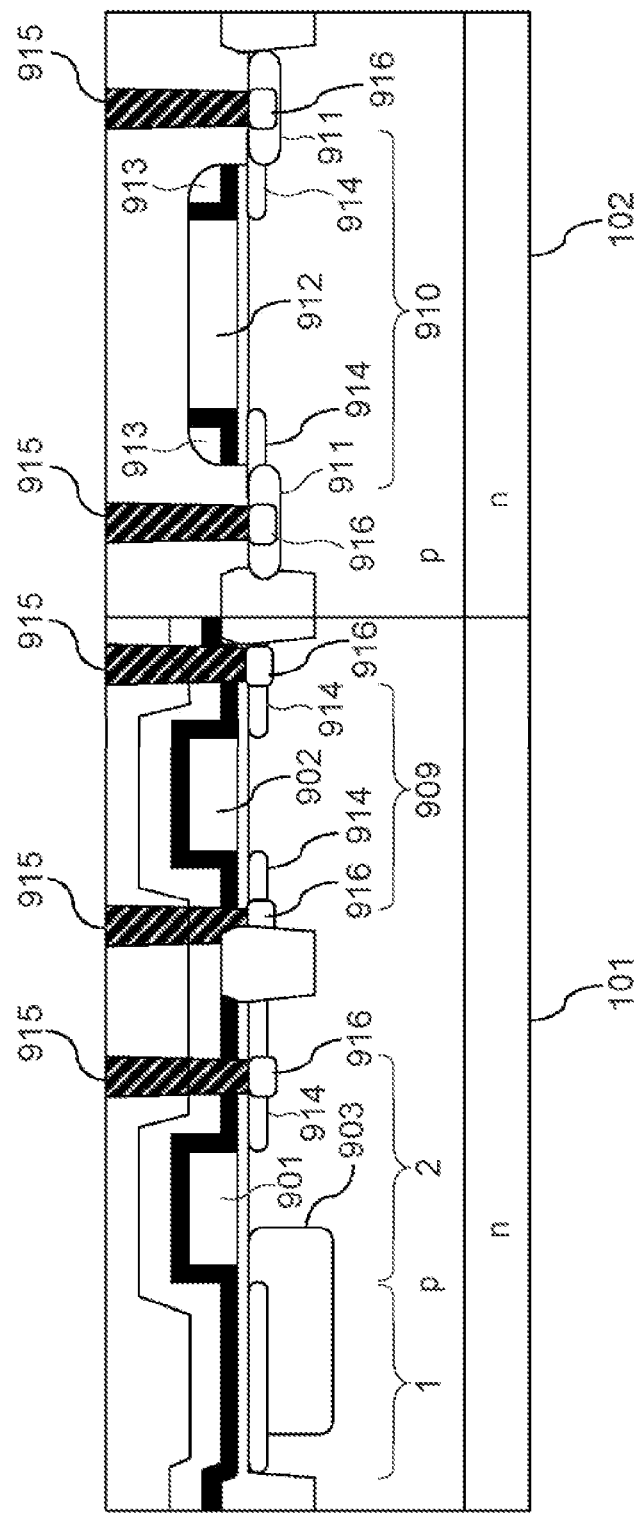
FIG. 8 is a schematic sectional view of a solid-state image sensor for explaining the embodiment of the present invention.

FIG. 8 is a schematic cross sectional view of the solid-state image sensor. The solid-state image sensor includes a pixel region 101 and a peripheral circuit region 102. The pixel region 101 includes an amplification MOS transistor 909 configured to read a signal from the photoelectric conversion element. The peripheral circuit region 102 includes a MOS transistor 910 that constitutes, for example, one of the signal processing circuit 112, the vertical shift register 113, and the horizontal shift register 114.

The source and drain regions of the MOS transistor 910 employ the LDD structure. In the LDD structure, a semiconductor region 911 where the impurity concentration is so high not to impair the driving capability of the MOS transistor is formed in an intermediate region closer to the channel than a semiconductor region 916. In addition, the LDD structure includes a semiconductor region 914 having an impurity concentration lower than that of the semiconductor region 911 and closer to the channel than the intermediate region. The semiconductor region 914 is formed under each sidewall spacer 913 and serves as an electro field reduction layer against the hot carrier. Moreover, the semiconductor region 916 that exhibits a low resistance and an ohmic characteristic is formed under each contact hole for contact plug 915. The impurity concentration of the semiconductor region 916 is higher than that of the semiconductor region 911. The source region and the drain region of the MOS transistor 909 arranged in the pixel region has a single drain structure. Each of the source and drain regions of the MOS transistor 909 arranged in the pixel region 101 has an impurity concentration lower than that of the semiconductor region 911 of the MOS transistor 910 and serves as an electro field reduction layer not to generate the hot carrier.

The pixel region where the electro field must be reduced for the purpose of, for example, miniaturization needs to include a widely formed electro field reduction layer. Considering the etching damage upon forming the sidewall spacer on the gate sidewall, it is advantageous for the pixel region not to adopt the LDD structure. On the other hand, if the electro field reduction layer is wide, or the impurity concentration is too low, the parasitic resistance (series resistance) of the transistor increases, largely damaging the driving capability of the transistor. For this reason, the resistance of the source region of the amplification MOS transistor for which the driving capability is especially important can be suppressed low.

In the embodiment of the present invention, to simultaneously miniaturize the solid-state image sensor and improve the driving capability of the amplification MOS transistor, the source and drain regions of the amplification MOS transistor have different structures. More specifically, the resistance of the source region of the amplification MOS transistor arranged in the pixel region is made lower than that of the drain region. This can be achieved by making the impurity concentration of the source of the amplification MOS transistor higher than that of the drain of the amplification MOS transistor.

Figure 2A:
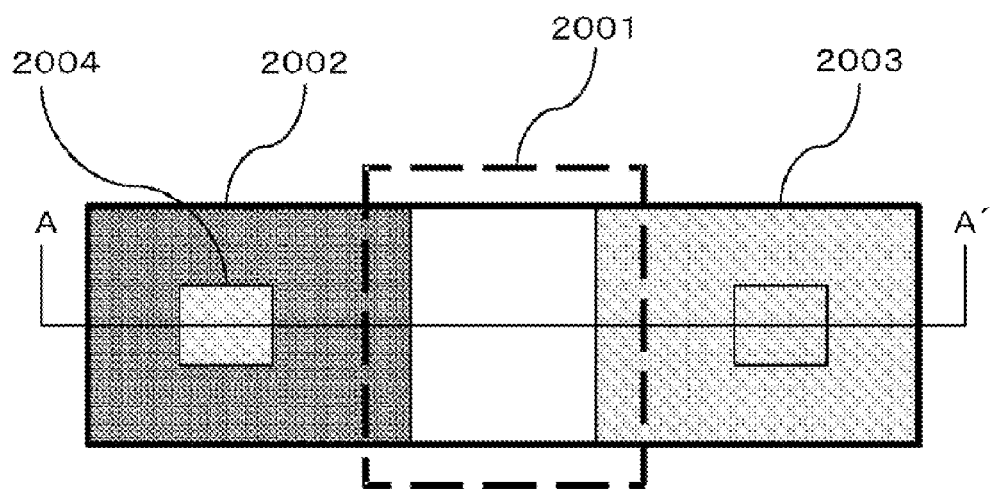
FIGS. 2A and 2B are a plan and sectional views, respectively, of an amplification MOS transistor of the solid-state image sensor according to the embodiment of the present invention.
Figure 2B:
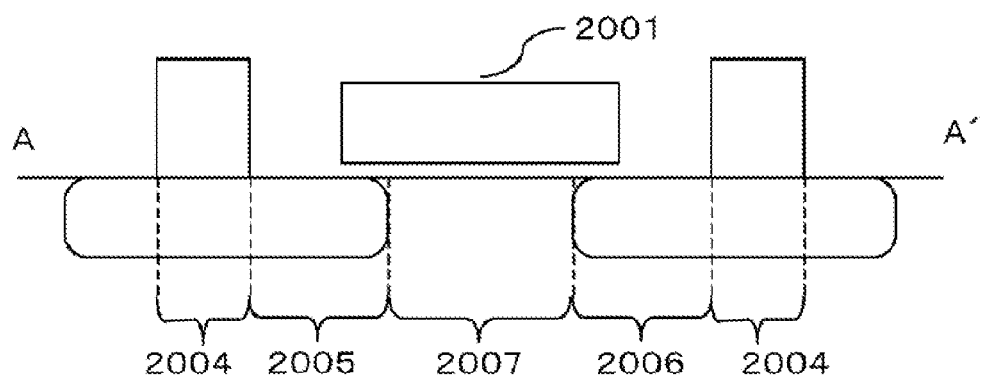

The relationship of the impurity concentration between the source region and the drain region of the amplification MOS transistor will be described with reference to FIGS. 2A and 2B. FIG. 2A is a plan view of the amplification MOS transistor arranged in the pixel region. FIG. 2B is a cross sectional view taken along a line A-A' in FIG. 2A. The amplification MOS transistor includes a gate electrode 2001, a source region 2002, a drain region 2003, and contact plug connection regions (first regions) 2004. The contact plug connection regions 2004 are arranged in correspondence with the source region 2002 and the drain region 2003, respectively. The contact plug connection region 2004 is sometimes arranged for only one of the source region 2002 and the drain region 2003. The contact plug connection region 2004 corresponding to the source and drain regions can have almost the same impurity concentration. The source region 2002 includes a semiconductor region (second region) 2005 arranged between a channel region 2007 and the connection region 2004. The drain region 2003 includes a semiconductor region (third region) 2006 arranged between the channel region 2007 and the connection region 2004. The impurity concentration of the semiconductor region 2005 is higher than that of the semiconductor region 2006. Making the impurity concentration of the source region higher than that of the drain region allows to improve the driving capability of the amplification MOS transistor arranged in the pixel region. This also enables to reduce the hot carrier of the MOS transistor arranged in the pixel region. In the pixel region, the sidewall spacer formation step is unnecessary because the LDD structure is not adopted. As a result, damage by the etching step of forming the LDD structure can be prevented.

Figure 5:
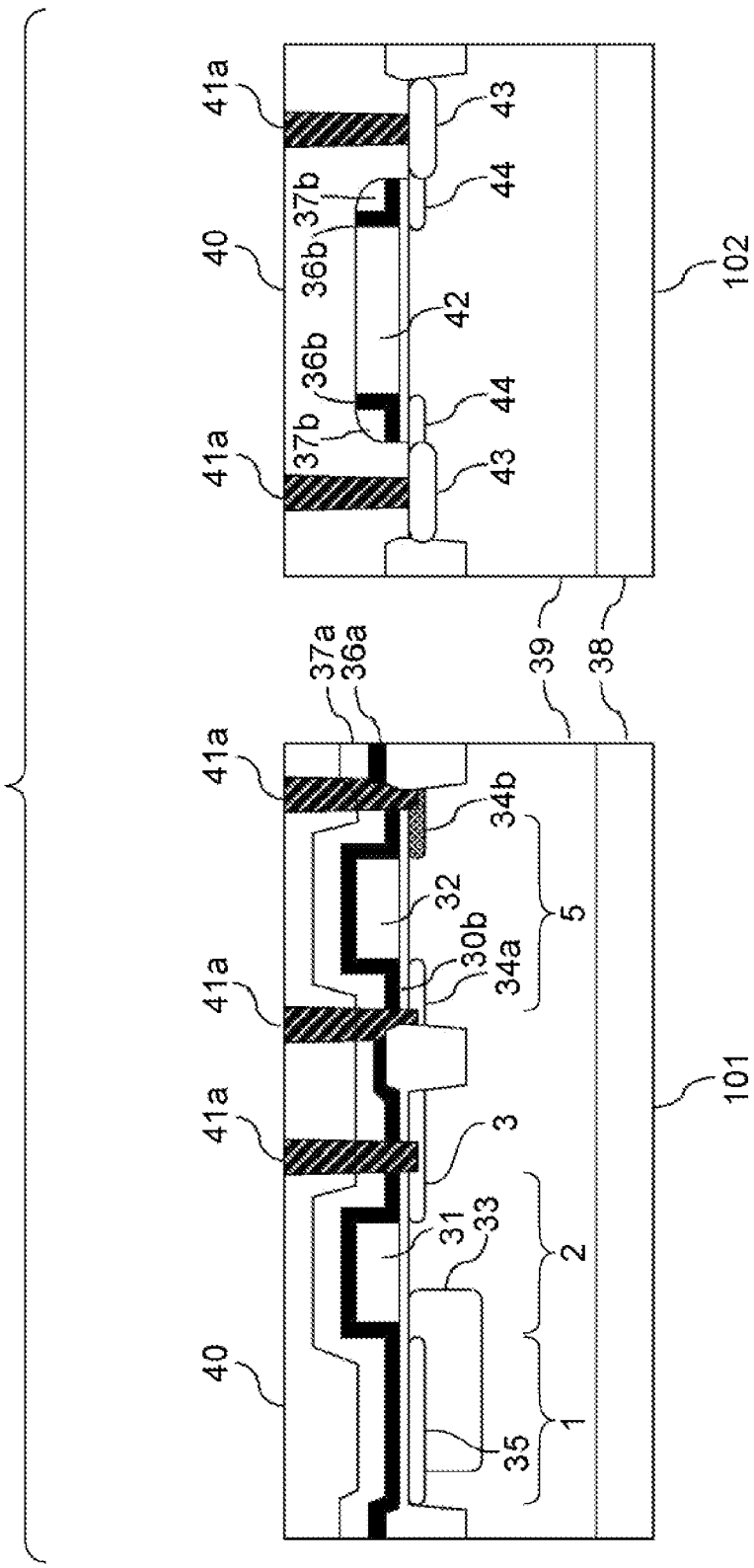
FIG. 5 is a schematic sectional view of a solid-state image sensor according to the first embodiment.

FIG. 5 is a schematic cross sectional view of the pixel region 101 and the peripheral circuit region 102 of the solid-state image sensor according to this embodiment. The pixel region 101 of FIG. 5 shows the sectional structures of the photoelectric conversion element 1, the transfer MOS transistor 2, and the amplification MOS transistor 5. The peripheral circuit region 102 shows a MOS transistor that constitutes one of the signal processing circuit 112, the vertical shift register 113, and the horizontal shift register 114. The solid-state image sensor shown in FIG. 5 is formed on a semiconductor substrate 38. An n- or p-type well 39 is formed in the semiconductor substrate 38. The photoelectric conversion element 1 and semiconductor regions that are prospective MOS transistors are formed in the well 39.

In the pixel region 101 of FIG. 5, when the charges to be stored in the photoelectric conversion element 1 are electrons, a semiconductor region 33 of the first conductivity type that constitutes the photoelectric conversion element 1 is of an n type. The transfer MOS transistor 2 includes a gate electrode 31, the semiconductor region 33 that functions as the source, and the semiconductor region 3 that functions as the drain. The semiconductor region 33 commonly serves as the source region of the transfer MOS transistor 2 and the semiconductor region that forms the photoelectric conversion element 1. The semiconductor region 3 commonly serves as the source of the reset MOS transistor (not shown) and the semiconductor region 3 that constitutes the floating diffusion (FD) 3. The amplification MOS transistor 5 includes a gate electrode 32, a semiconductor region 34a that functions as the drain, and a semiconductor region 34b that functions as the source. The semiconductor region 34a can be given a reference voltage for pixel selection. A silicon nitride film 36a and a silicon oxide film 37a are sequentially stacked on the surface of the semiconductor substrate. The silicon nitride film 36a and the silicon oxide film 37a form an insulating film. The insulating film formed by the silicon nitride film 36a and the silicon oxide film 37a covers the whole region except the contact bottom portions in the pixel region 101. The silicon nitride film 36a and the silicon oxide film 37a can also form an antireflection film that reduces reflection by the surface of the photoelectric conversion element. The insulating film need not always be formed by combining a silicon nitride film and a silicon oxide film. An electric conductor such as a contact plug 41a is in contact with the semiconductor region. The FD 3 is connected to the gate electrode of the amplification MOS transistor via an electrode (not shown). The semiconductor region 34a is also connected to the amplification reference voltage line (not shown) via the electrode.

In the peripheral circuit region 102 of FIG. 5, the impurity concentration of a semiconductor region 43 serving as the source region or the drain region of a MOS transistor having the LDD structure is higher than that of a semiconductor region 44 serving as the electro field reduction layer. A silicon nitride film 36b and a silicon oxide film 37b that constitute sidewall spacer are formed on each side surface of the gate electrode 42.

When the silicon nitride film 36a and the silicon oxide film 37a in the pixel region 101 and the silicon nitride film 36b and the silicon oxide film 37b serving as the sidewall spacer in the peripheral circuit region 102 are formed in the same step, the manufacturing cost can be suppressed low.

The silicon nitride film 36a and the silicon oxide film 37a in the pixel region are usable as a mask when forming the semiconductor region 43 having a high impurity concentration in the peripheral circuit region 102 by ion implantation. Since it is unnecessary to independently prepare a mask, the manufacturing cost can be suppressed low.

In the pixel region 101, the amplification MOS transistor 5 has a single drain structure. The drain region 34a is formed from a semiconductor region having an impurity concentration lower than that of the source region 34b. This makes it possible to suppress degradation of the transistor characteristic caused by the hot carrier as compared to the LDD structure that includes a semiconductor region having a high impurity concentration in the drain region.

As described above, when the source region 34b of the amplification MOS transistor in the pixel region 101 is formed from a semiconductor region whose impurity concentration is higher than that of the drain region 34a of the amplification MOS transistor, the resistance of the source region 34b can be made lower than that of the drain region 34a. The source region to which no high electro field is applied as compared to the drain region side need not consider the influence of the hot carrier. The single drain structure is more suitable to miniaturization than the LDD structure including a sidewall spacer formed on the gate sidewall, and can also reduce noise such as a dark current generated by etching damage at the time of sidewall spacer formation.

In the semiconductor regions 3, 34a, and 34b of the MOS transistor arranged in the pixel region 101, the contact area that is in contact with the bottom portion of each contact plug 41a needs to ensure an impurity concentration that enables electrical connection of a metal interconnection. The impurity concentration is ensured by implanting an impurity through a contact hole opening portion.

The silicon nitride film 36a in the pixel region 101 may be used as an etching stopper upon anisotropic dry etching for forming the contact holes in an interlayer insulating film made of BPSG (Boron Phosphorus Silicon Glass) or the like. After the anisotropic dry etching, anisotropic etching is performed for the silicon nitride film 36a and the silicon oxide film 37a under etching conditions with selectivity, thereby completing the contact holes. According to this method, even if the contact hole is formed on the element isolation region due to misalignment upon etching the interlayer insulating film, the contact plug 41a does not come into contact with the element isolation region or the well 39 on the side surface. For this reason, the leakage current between the well 39 and the semiconductor regions 3, 34a, and 34b can be suppressed. It is therefore possible to shorten the distance between the contact plug and the element isolation region and thus miniaturize the element.

As the silicon nitride films 36a and 36b, a film containing a large number of hydrogen molecules is usable. In this case, after silicon nitride film formation, annealing is performed at 350° C. or more to diffuse hydrogen into the semiconductor substrate, thereby obtaining the termination effect of the dangling bond. Such a silicon nitride film can be formed by plasma CVD.

Figure 6A:
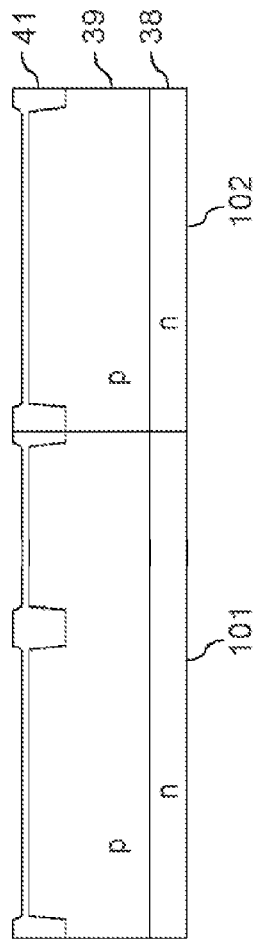

A method of manufacturing the solid-state image sensor will be described next with reference to FIGS. 6A to 6F. First, as shown in FIG. 6A, a well (not shown) of the first conductivity type (n type) and a well 39 of the second conductivity type (p type) are formed in a semiconductor substrate 38 made of silicon or the like. Next, an element isolation region 41 is formed by STI (Shallow Trench Isolation) or selective oxidation method. Note that in FIGS. 6A to 6F, a pixel region 101 and a peripheral circuit region 102 are adjacently illustrated for the descriptive convenience.

Figure 6B:
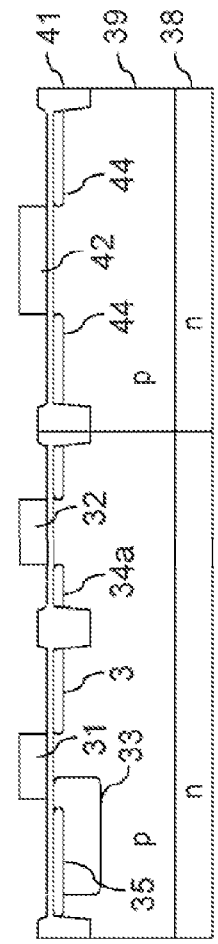

As shown in FIG. 6B, gate electrode 31 and 32 of MOS transistors in the pixel region and a gate electrode 42 of a MOS transistor in the peripheral circuit region are formed by polysilicon in the well 39 of the semiconductor substrate 38. After the gate electrode formation step, an n-type impurity is introduced to form an n-type semiconductor region (storage region) 33 of a photodiode that forms a photoelectric conversion element. Next, a p-type impurity is introduced to form a p-type semiconductor region 35 in the surface of the n-type semiconductor region 33 so that the photodiode has a buried structure. Then, an n-type impurity is introduced by ion implantation (first implantation step) using the gate electrodes 31, 32, and 42 as a mask. Semiconductor regions 3, 34a, 34b, and 44 that are prospective source and drain regions in self-alignment with the gate electrodes are formed in the source formation regions (the portions of the prospective source regions) and the drain formation regions (the portions of the prospective drain regions) on the side surfaces of the gate electrodes.

Figure 6C:
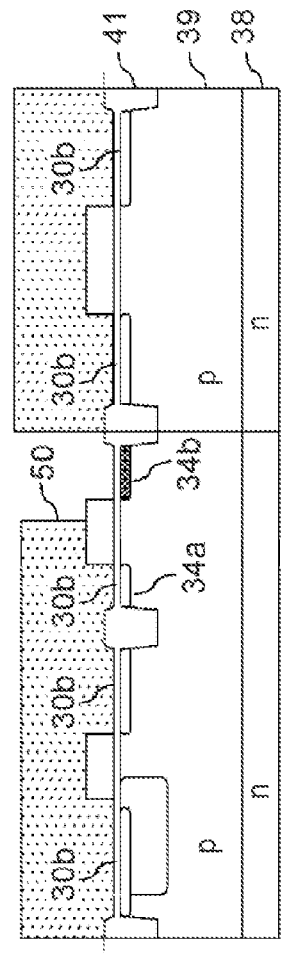

As shown in FIG. 6C, a resist 50 having an opening that exposes the source region of the amplification MOS transistor is formed on the pixel region and the peripheral circuit region. Next, an n-type impurity is introduced to the source region 34b of the amplification MOS transistor by selectively performing ion implantation (second implantation step) using the gate electrode 32 as a mask. This allows to make the impurity concentration of the source region 34b of an amplification MOS transistor 5 higher than that of the drain region 34a.

A thin silicon oxide film 30b is formed on the surface layer of the semiconductor substrate except the element isolation region and the gate electrodes. The thin polysilicon oxide film may be formed by leaving the gate oxide film on the surface layer of the semiconductor substrate, which is formed upon anisotropic dry etching for forming polysilicon gate electrodes. Alternatively, the thin polysilicon film may be formed by thermal oxidation before deposition of a silicon nitride film 36. Otherwise, the thin polysilicon film may be formed by depositing a silicon oxide film. Then, as shown in FIG. 6D, the silicon nitride film 36 is formed on the surface of the semiconductor substrate, and a silicon oxide film 37 is formed on the silicon nitride film. The silicon nitride film 36 and the silicon oxide film 37 serve as an insulating film that covers the pixel region 101 and the peripheral circuit region 102.

A resist 51 is formed on the pixel region, and etch back is performed to leave part of the silicon nitride film 36 and the silicon oxide film 37 on the side surfaces of the gate electrode 42 in the peripheral circuit region 102. A sidewall spacer including a silicon nitride film 36b and the silicon oxide film 37b is thus formed on each sidewall of the gate electrode 42 in the peripheral circuit region 102, as shown in FIG. 6E. An n-type impurity is introduced (third implantation step) using the gate electrode 42 and the sidewall spacers in the peripheral circuit region 102 as a mask. The source and drain regions in self-alignment with the side surfaces of the sidewall spacers can thus change to semiconductor regions 43 whose impurity concentration is higher than that of the semiconductor region 44. At this time, the silicon nitride film 36 and the silicon oxide film 37, which remain on the entire surface, may be used as a mask in the pixel region 101. In this case, since it is unnecessary to independently form a mask, the manufacturing cost can is suppressed. The structure as shown in FIG. 6E is thus obtained.

Next, as shown in FIG. 6F, an interlayer insulating film 40 of BPSG or the like is formed to wholly cover the pixel region 101 and the peripheral circuit region 102. Contact holes for contact plugs 41a and 41b are formed in the interlayer insulating film 40 by anisotropic dry etching. At this time, the silicon nitride film 36a in the pixel region is used as the etching stopper, thereby forming contact holes for which the contact area in contact with the contact bottom portion in the pixel region 101 is self-aligned with the semiconductor substrate. The contact holes for contact plugs 41a and 41b are filled with an electric conductor, thereby forming the contact plugs. The structure shown in FIG. 6F is thus obtained. Annealing at 350° C. or more can be performed in one of the steps after silicon oxide film formation.

An example has been described above in which an n-channel MOS transistor formed on a p-type semiconductor substrate is used. When forming a solid-state image sensor by the CMOS process, a p-channel MOS transistor can be formed in the same way as described above by changing the conductivity type. The carrier mobility is lower in the p-channel MOS transistor than in the n-channel MOS transistor. It is therefore important to improve the driving capability of the amplification MOS transistor, as in this embodiment.

In the embodiment described above, the amplification MOS transistor arranged in the pixel region has a single drain structure in which the source region is formed from a semiconductor having an impurity concentration higher than that of the drain region. The MOS transistor arranged in the peripheral circuit region has the LDD structure. The low impurity concentration region of the drain region of the amplification MOS transistor arranged in the pixel region can be formed in the same step as that of the low impurity concentration region of the LDD structure of the MOS transistor arranged in the peripheral circuit region. The solid-state image sensor formed by this process can simultaneously suppress the characteristic degradation of the amplification MOS transistor in the pixel region caused by the hot carrier and implement a high driving capability of the amplification MOS transistor.

When the antireflection film is used as the etching stopper, the contact holes in the pixel portion are in contact with only the surface of the semiconductor substrate in self-alignment. This allows to suppress the leakage current between the well and the sources and drains of the MOS transistors.

The insulating film is used as the antireflection film and the etching stopper for the contacts in the pixel region and as the sidewall spacers of the MOS transistor in the peripheral circuit region. This enables to suppress the manufacturing cost low.

When the insulating film is formed from a silicon nitride film containing a large number of hydrogen molecules, traps on the interfaces of the transistors or the interface between silicon and the silicon oxide film on the photodiode can effectively be reduced.

Second Embodiment

Figure 3A:
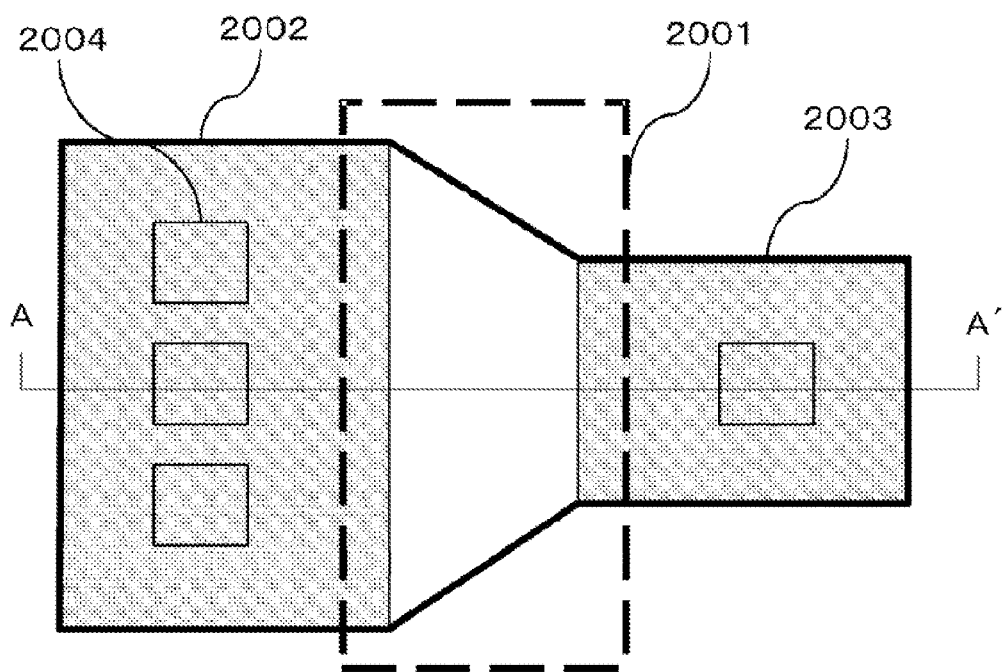
FIGS. 3A and 3B are a plan and sectional views, respectively, of an amplification MOS transistor of the solid-state image sensor according to the embodiment of the present invention.
Figure 3B:
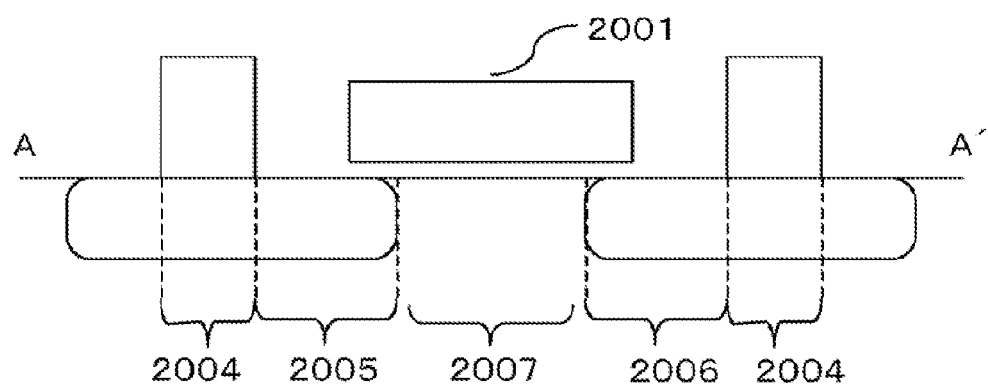

In this embodiment, an example will be described in which the resistance of the source of an amplification MOS transistor 5 is lower than that of the drain. FIG. 3A is a plan view of the amplification MOS transistor 5 arranged in the pixel region. FIG. 3B is a cross sectional view taken along a line A-A' in FIG. 3A.

The amplification MOS transistor 5 includes a gate electrode 2001, a source region 2002, a drain region 2003, contact plug connection regions 2004 (first regions), and a channel region 2007. The contact plug connection regions 2004 are arranged in correspondence with the source region 2002 and the drain region 2003, respectively. The contact plug connection region 2004 is sometimes arranged for only one of the source region 2002 and the drain region 2003. The source region of the amplification MOS transistor 5 also includes a semiconductor region 2005 (second region) arranged between the channel region 2007 and the first region. The drain region of the amplification MOS transistor 5 includes a semiconductor region 2006 (third region) arranged between the channel region 2007 and the first region. The contact length between the semiconductor region 2005 (second region) and the channel region 2007 is longer than that between the semiconductor region 2006 (third region) and the channel region 2007. In other words, the channel width of the amplification MOS transistor is larger at the source edge than at the drain edge. The boundary of the channel region is defined by the element isolation portion. Examples of the element isolation portions are field oxide film isolation, STI, p-n junction isolation, and EDI isolation. Although not illustrated, the channel region may be defined by the gate electrode. In this case, the channel is formed by making the gate width of the gate electrode is larger at the source edge wider than at the drain edge.

The contact area between the contact plug and the semiconductor region on the source side may be larger than that between the contact plug and the semiconductor region on the drain side. For this purpose, the area of the first region corresponding to the source region may be larger than the area of the second region corresponding to the drain region.

This structure enables to decrease the resistance of the source region of the amplification MOS transistor arranged in the pixel region. Hence, the driving capability of the amplification MOS transistor can be improved.

According to the structure in which the channel width on the drain side of the amplification MOS transistor is smaller than that on the source side, as shown in FIGS. 3A and 3B, the capacitance between the gate electrode and the drain region can be reduced. This allows to reduce the capacitance of the floating diffusion portion electrically connected to the gate electrode. It is therefore possible to increase the gain of conversion from read charges to a voltage. If the charge-to-voltage conversion gain of the floating diffusion portion is high, noise of the subsequent stage can be made smaller. Maintaining the large channel width on the source side allows to increase Gm. For this reason, low-frequency noise such as RTS noise can be made smaller even if the gate area is the same.

Third Embodiment

In this embodiment, the contact area of the drain region, which is in direct contact with an electric conductor, will be explained. In general, the contact between the source and drain of a MOS transistor and an electric conductor such as a contact plug electrically connected to the wiring pattern of the interconnection layer is required to exhibit a low resistance and an ohmic characteristic. For the solid-state image sensor that is sensitive to a point defect caused by a metal impurity, application of the silicide forming process is sometime prohibited intentionally. Hence, how to form the ohmic contact between the drain region and the electric conductor is important for the solid-state image sensor.

If the drain region of a MOS transistor arranged in the pixel region as in the above-described embodiments has an electro field reduction structure, a demand arises for a method of forming a contact exhibiting a low resistance and an ohmic characteristic. A structure and manufacturing method of a solid-state image sensor that meets the requirement will be described below. FIG. 7 is a cross sectional view of a solid-state image sensor according to this embodiment. The same reference numerals as in the first and second embodiments denote components with the same functions, and a detailed description thereof will be omitted. Reference numeral 101 denotes a floating diffusion (FD) 3 arranged in the pixel region, that is, the connection portion between the electric conductor and the drain region of the transfer MOS transistor (n type, in this embodiment); 104, a contact portion between the electric conductor and the source or drain region of an n-type MOS transistor arranged in the peripheral circuit region; and 105, a connection portion between the electric conductor and the source or drain region of a p-type MOS transistor arranged in the peripheral circuit region.

As indicated by the reference numeral 101, the FD 3 includes an n-type semiconductor region 45 that has a high impurity concentration and is in direct contact with an electric conductor, contact plug 41a. In the contact portions 104 and 105 as well, the source and drain regions include n- and p-type semiconductor regions 45 and 46 having a high impurity concentration, respectively. Applying the structure of this embodiment allows to obtain a low resistance and an excellent ohmic characteristic in all contact plugs 41a, 41b, and 41c.

The method of manufacturing the solid-state image sensor according to this embodiment will be described next.

The solid-state image sensor is formed by the same process as that of the procedure described in the first embodiment up to FIG. 6E. The impurity concentration of the semiconductor region having the low impurity concentration can be set to about $1\times10^{17}/cm^3 \le d1 \le 5\times10^{18}/cm^3$. After that, contact holes corresponding to the source and drain regions to be connected to the electric conductor are formed by anisotropic dry etching. Then, an n-type impurity represented by phosphorus (P) is introduced to a contact bottom portion corresponding to the FD 3 arranged in the pixel region and a contact bottom portion corresponding to a semiconductor region 43 arranged in a peripheral circuit region 102 using a photo mask. To obtain a low resistance and an ohmic characteristic for the contact to the semiconductor region 3 in the pixel region, the dose can be set such that an impurity concentration d2 of the semiconductor region in direct contact with the contact plug satisfies $5\times10^{18}/cm^3 \le d2 \le 5\times10^{19}/cm^3$. Note that considering cost reduction, the n-type impurity may be introduced to the entire region without using the photo mask.

Next, a p-type impurity represented by boron (B) is introduced to the contact portion 105 between the electric conductor and the source or drain region of the p-type MOS transistor arranged in the peripheral circuit region using a photo mask, thereby forming a n-type semiconductor region having a high impurity concentration. At this time, the n-type impurity may have been introduced to the p-type semiconductor region by the above-described implantation of the n-type impurity ions to the entire surface. In this case, a mask pattern is formed to cover the entire contact portion 104 of the electric conductor, the source region and drain region of the n-type MOS transistor arranged in the peripheral circuit region. The p-type impurity ion implantation condition needs to be set such that the impurity concentration exceeds the concentration of the n-type impurity introduced by the ion implantation to the entire surface. For example, the dose at this time can be set to about $1.0\times10^{15}/cm$ such that an impurity concentration d3 of the region in direct contact with the contact plug satisfies $5\times10^{18}/cm^3 \le d3 \le 5\times10^{19}/cm^3$.

The manufacturing method of this embodiment is applicable to the above-described first and second embodiments. The method is also applicable to various kinds of MOS transistors arranged in the pixel region.

Fourth Embodiment

As a characteristic feature of this embodiment, the impurity concentration of the source region of an amplification MOS transistor included in a pixel is higher than that of the drain region.

FIG. 1 is a plan view showing the arrangement of a solid-state image sensor according to this embodiment. Reference numeral 111 denotes a pixel region. A plurality of pixels is arrayed in the pixel region 111. The structure of the pixel region 111 and that of a pixel are the same as those of the solid-state image sensor of the first embodiment, and a detailed description thereof will be omitted here. In this embodiment, however, the structure of the amplification MOS transistor may be different from that of the solid-state image sensor of the first embodiment.

A signal processing circuit 112 includes a circuit that amplifies the signal read from the pixel region 111. A vertical shift register 113 is configured to drive the pixels arranged in the pixel region 111. A horizontal shift register 114 is configured to drive the signal processing circuit 112. The signal processing circuit 112, the vertical shift register 113, and the horizontal shift register 114 are arranged in the peripheral circuit region. These circuits are the same as those of the solid-state image sensor of the first embodiment, and a detailed description thereof will be omitted.

FIG. 4 shows an example of one pixel arrayed in the pixel region 111. The pixel circuit of the solid-state image sensor of this embodiment is the same as that of the first embodiment, and a detailed description thereof will be omitted here.

In this embodiment, the impurity concentration of the drain region of the MOS transistor in the pixel region is lower than that of the peripheral region, and the MOS transistor in the peripheral circuit region has the LDD structure.

FIG. 8 is a schematic cross sectional view of the solid-state image sensor according to this embodiment. The solid-state image sensor includes a pixel region 101 and a peripheral circuit region 102. The pixel region 101 includes an amplification MOS transistor 909 configured to read a signal from the photoelectric conversion element. The peripheral circuit region 102 includes a MOS transistor 910 that constitutes, for example, one of the signal processing circuit 112, the vertical shift register 113, and the horizontal shift register 114.

The source and drain regions of the MOS transistor 910 in the peripheral circuit region employ the LDD structure. The LDD structure includes a semiconductor region 911 where the impurity concentration is so high not to impair the driving capability of the MOS transistor, and a semiconductor region 914 having an impurity concentration lower than that of the semiconductor region 911. The semiconductor region 914 is formed under each sidewall spacer 913 and serves as an electro field reduction layer against the hot carrier. Moreover, a semiconductor region 916 that exhibits a low resistance and an ohmic characteristic is formed under each contact hole for contact plug 915. The impurity concentration of the semiconductor region 916 is higher than that of the semiconductor region 911. The drain region of the amplification MOS transistor 909 arranged in the pixel region has a single drain structure. The drain region of the amplification MOS transistor 909 arranged in the pixel region 101 has an impurity concentration lower than that of the semiconductor region 911 of the MOS transistor 910 arranged in the peripheral region and serves as an electro field reduction layer not to generate the hot carrier. Note that in this embodiment, the source region of the amplification MOS transistor 909 arranged in the pixel region 101 can have any structure. For example, the source region of the amplification MOS transistor 909 may have the LDD structure. The impurity concentration of the source region of the amplification MOS transistor 909 can be almost equal to or higher than that of the source region or the drain region of the MOS transistor 910 arranged in the peripheral circuit region 102.

The pixel region where the electro field must be reduced for the purpose of, for example, miniaturization needs to include a widely formed electro field reduction layer. Considering the etching damage upon forming the sidewall spacer on the gate sidewall, it is advantageous for the pixel region not to adopt the LDD structure. On the other hand, if the electro field reduction layer is wide, or the impurity concentration is too low, the parasitic resistance (series resistance) of the transistor increases, largely damaging the driving capability of the transistor. For this reason, the resistance of the source region of the amplification MOS transistor for which the driving capability is especially important can be suppressed low.

The pixel region 101 of FIG. 8 shows the cross sectional structures of a photoelectric conversion element 1, a transfer MOS transistor 2, and the amplification MOS transistor 909. The peripheral circuit region 102 shows the MOS transistor 910 that constitutes one of the signal processing circuit 112, the vertical shift register 113, and the horizontal shift register 114. The solid-state image sensor shown in FIG. 8 is formed on a semiconductor substrate. An n- or p-type well is formed in the semiconductor substrate. The photoelectric conversion region 1 and semiconductor regions that are prospective MOS transistors are formed in the well.

In the pixel region 101 of FIG. 8, when the charges to be stored in the photoelectric conversion element 1 are electrons, a semiconductor region 903 of the first conductivity type that constitutes the photoelectric conversion element 1 is of an n type. The transfer MOS transistor 2 includes a gate electrode 901, the semiconductor region 903 that functions as the source, and the semiconductor region 914 that functions as the drain. The semiconductor region 903 commonly serves as the source region of the transfer MOS transistor 2 and the semiconductor region that forms the photoelectric conversion element 1. The semiconductor region 914 commonly serves as the source of the reset MOS transistor (not shown) and the semiconductor region that constitutes the floating diffusion (FD) portion 3. The amplification MOS transistor 909 includes a gate electrode 902, the semiconductor region 914 that functions as the drain, and the semiconductor region 914 that functions as the source. The semiconductor region 914 that functions as the drain of the amplification MOS transistor 909 can be given the power supply voltage. A silicon nitride film and a silicon oxide film are sequentially stacked on the surface of the photoelectric conversion element 1. The silicon nitride film and the silicon oxide film form an insulating film. The insulating film formed by the silicon nitride film and the silicon oxide film can cover the whole region except the contact bottom portions in the pixel region 101. The silicon nitride film and the silicon oxide film can also form an antireflection film that reduces reflection by the surface of the photoelectric conversion element. The insulating film need not always be formed by combining a silicon nitride film and a silicon oxide film. An electric conductor such as the contact plug 915 is in contact with the semiconductor region. The semiconductor region 914 that functions as the drain of the transfer MOS transistor 2 and the floating diffusion (FD) 3 is connected to the gate electrode of the amplification MOS transistor via an electrode (not shown). The semiconductor region 914 that functions as the drain of the amplification MOS transistor 909 is also connected to the power supply voltage line (not shown) via the electrode.

In the peripheral circuit region 102 of FIG. 8, the impurity concentration of the semiconductor region 911 serving as the source region or the drain region of the MOS transistor 910 having the LDD structure is higher than that of the semiconductor region 914 serving as the electro field reduction layer. A silicon nitride film and a silicon oxide film that constitute sidewall spacer are formed on each side surface of the gate electrode 912.

When the silicon nitride film and the silicon oxide film in the pixel region 101 and the silicon nitride film and the silicon oxide film serving as the sidewall spacer in the peripheral circuit region 102 are formed in the same step, the manufacturing cost can be suppressed low.

The semiconductor regions 914 of the MOS transistor arranged in the pixel region 101 and the semiconductor regions 911 of the MOS transistor arranged in the peripheral circuit region 102 are in contact with the bottom portions of the contact plugs 915. Each contact portion needs to ensure an impurity concentration that enables electrical connection of a metal interconnection. The impurity concentration is ensured by implanting an impurity through a contact hole opening portion.

The silicon nitride film in the pixel region 101 may be used as an etching stopper. For example, the silicon nitride film can be used as an etching stopper upon anisotropic dry etching for forming the contact holes in an interlayer insulating film made of BPSG (Boron Phosphorus Silicon Glass) or the like. After the anisotropic dry etching, anisotropic etching is performed for the silicon nitride film and the silicon oxide film under etching conditions with selectivity, thereby completing the contact holes. According to this method, even if the contact hole is formed on the element isolation region due to misalignment upon etching the interlayer insulating film, the contact plug 915 does not come into contact with the element isolation region or the well on the side surface. For this reason, the leakage current between the well and the semiconductor regions can be suppressed. It is therefore possible to shorten the distance between the contact plug and the element isolation region and thus miniaturize the element.

As the silicon nitride films, a film containing a large number of hydrogen molecules is usable. In this case, after silicon nitride film formation, annealing is performed at 350° C. or more to diffuse hydrogen into the semiconductor substrate, thereby obtaining the termination effect of the dangling bond. Such a silicon nitride film can be formed by plasma CVD.

In the embodiment of the present invention, to simultaneously miniaturize the solid-state image sensor and improve the driving capability of the amplification MOS transistor, the source and drain regions of the amplification MOS transistor have different structures. More specifically, the impurity concentration of the source region of the amplification MOS transistor is higher than that of the drain region of the amplification MOS transistor. This allows the resistance of the source region of the amplification MOS transistor arranged in the pixel region to be made lower than that of the drain region and thus improve the driving capability of the amplification MOS transistor.

Figure 9A:
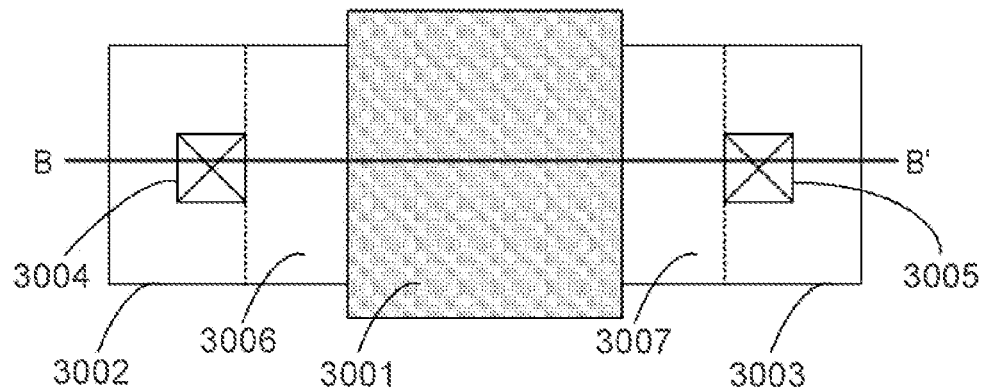
FIGS. 9A to 9C are a plan and sectional views, respectively, of an amplification MOS transistor of a solid-state image sensor according to the fourth embodiment.
Figure 9B:
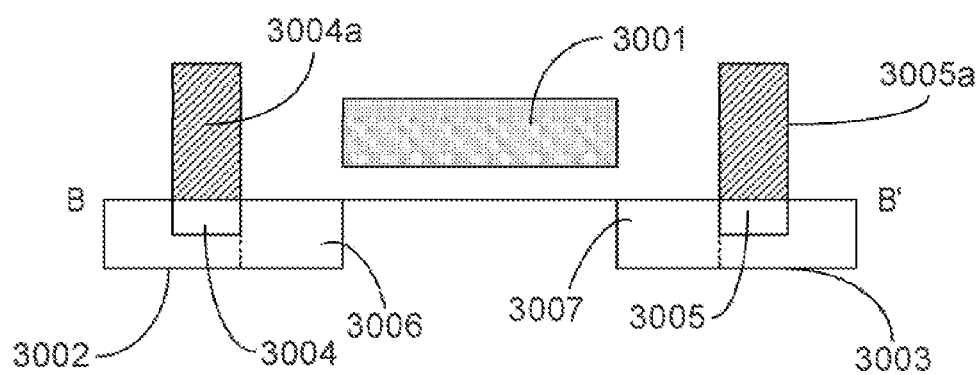
Figure 9C:
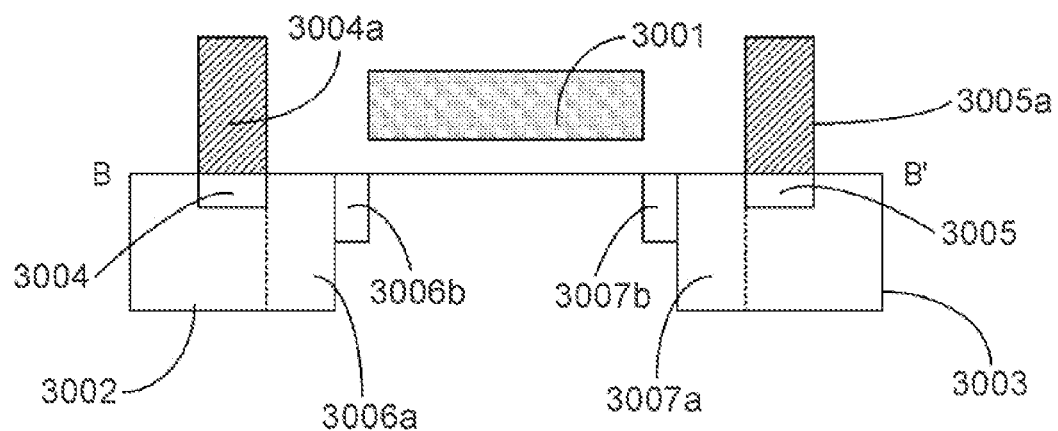

The impurity concentration distribution will be described in detail with reference to FIGS. 9A to 9C. FIG. 9A is a plan view of the amplification MOS transistor arranged in the pixel region. FIG. 9B is a cross sectional view taken along a line B-B' in FIG. 9A. FIG. 9C is a cross sectional view of a modification of the embodiment taken along the line B-B' in FIG. 9A.

The amplification MOS transistor includes a gate electrode 3001, a source region 3002, and a drain region 3003. The amplification MOS transistor also includes a contact plug connection region 3004 on the source side and a contact plug connection region 3005 on the drain side. Only one of the plug connection regions 3004 and 3005 may be arranged, or neither may be arranged. If the source region 3002 or the drain region 3003 also serves as the source region or the drain region of another transistor, the contact plugs need not always be arranged.

The source region 3002 includes a region 3006 arranged between the gate electrode 3001 and the contact plug connection region 3004. The drain region 3003 includes a region 3007 arranged between the gate electrode 3001 and the contact plug connection region 3005.

The feature of this embodiment is the relationship of the impurity concentration between the two regions 3006 and 3007. On the section shown in FIG. 9B, the impurity concentration of the whole region 3006 is higher than that of the highest impurity concentration portion of the region 3007. The remaining portions can have any impurity concentration relationship. For example, the impurity concentration of the plug connection region 3005 on the drain side can be higher than that of the region 3006. In particular, to reduce the contact resistance between a contact plug 3005a and the drain region 3003, it is advantageous for the plug connection region 3005 to have a high impurity concentration. Out of the source region 3002, the portion except the region 3006 can have an impurity concentration almost equal to or different from that of the region 3006. In addition, out of the drain region 3003, the portion except the region 3007 can have an impurity concentration almost equal to or different from that of the region 3007.

Thus making the impurity concentration of the entire region 3006 higher than that of the highest impurity concentration portion of the region 3007 allows the driving capability of the amplification MOS transistor to be improved and reduce the hot carrier.

FIG. 9C is a sectional view of a modification of the embodiment. Referring to FIG. 9C, the region 3006 arranged between the gate electrode 3001 and the contact plug connection region 3004 of the source region 3002 includes regions 3006a and 3006b having different impurity concentrations. In addition, the region 3007 arranged between the gate electrode 3001 and the contact plug connection region 3005 of the drain region 3003 includes regions 3007a and 3007b having different impurity concentrations. The same reference numerals as in FIG. 9B denote parts with the same structures in FIG. 9C.

The impurity concentration of the region 3006a is higher than that of the region 3006b. The region 3006b is arranged between the region 3006a and the gate electrode 3001. The impurity concentration of the region 3007a is higher than that of the region 3007b. The region 3007b is arranged between the region 3007a and the gate electrode 3001. The impurity concentration of the region 3006a is higher than that of the region 3007a. On the other hand, the regions 3006b and 3007b have almost the same impurity concentration. That is, only part of the region 3006 arranged between the gate electrode 3001 and contact plug connection region 3004 on the source side may have an impurity concentration higher than that of the region 3007.

Thus making the impurity concentration of at least a partial region of the region 3006 higher than that of the highest impurity concentration portion of the region 3007 allows the driving capability of the amplification MOS transistor to be improved and reduce the hot carrier.

As described above, the impurity concentration of the source region of the amplification MOS transistor is higher than that of the drain region of the amplification MOS transistor. This allows the resistance of the source region of the amplification MOS transistor arranged in the pixel region to be made lower than that of the drain region and thus improve the driving capability of the amplification MOS transistor.

Fifth Embodiment

Figure 10:
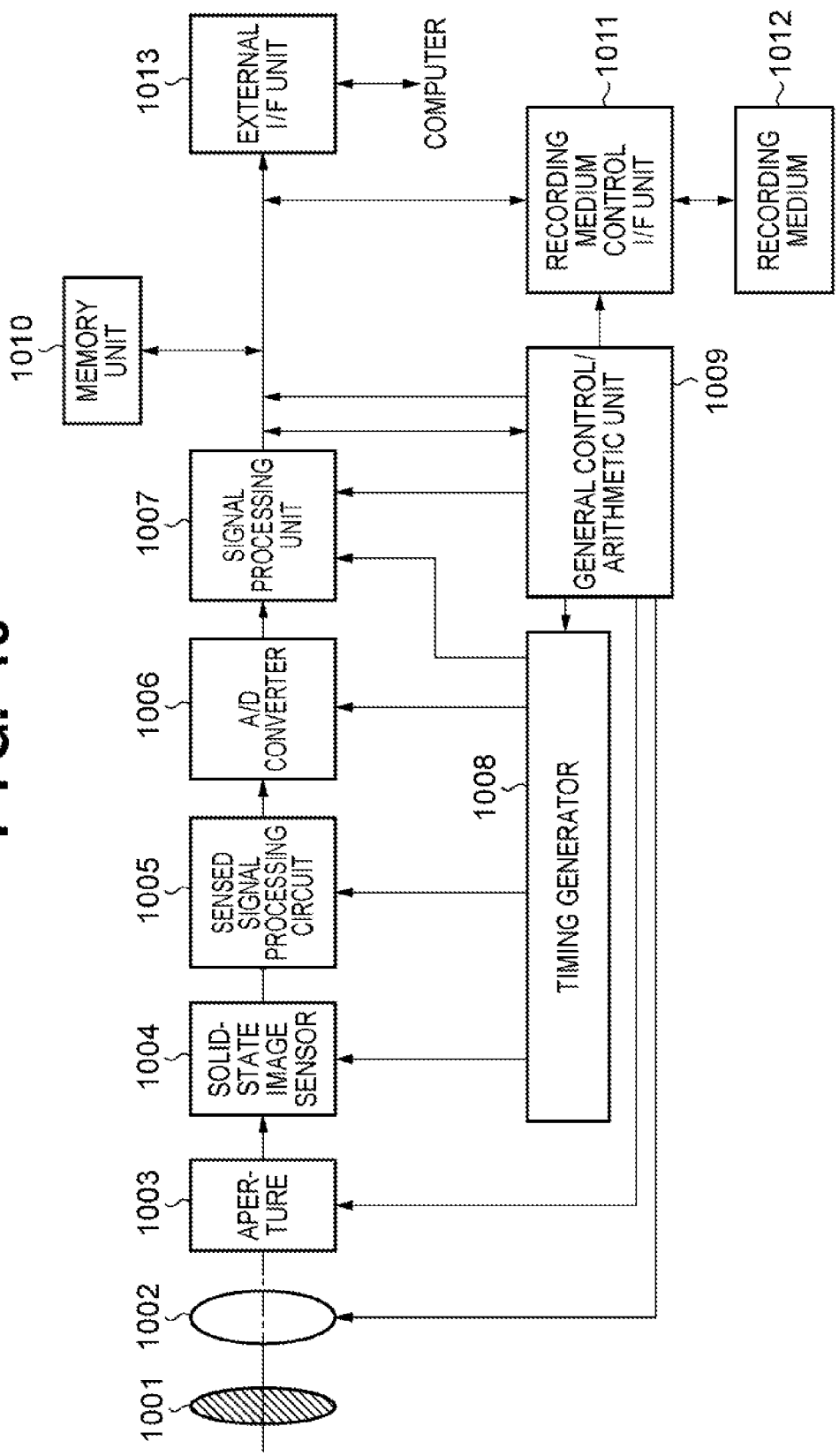
FIG. 10 is a block diagram for explaining an imaging system using the solid-state image sensor.

FIG. 10 is a block diagram showing an application example of the solid-state image sensor according to the present invention to an imaging system.

The optical system includes a photographing lens 1002, a shutter 1001, and an aperture 1003, and forms an image of an object on a solid-state image sensor 1004.

The signal output from the solid-state image sensor 1004 is processed by a sensed signal processing circuit 1005. An A/D converter 1006 converts the analog signal into a digital signal. The output digital signal further undergoes arithmetic processing of a signal processing unit 1007. The processed digital signal is stored in a memory unit 1010 or sent to an external device via an external I/F unit 1013. The solid-state image sensor 1004, the sensed signal processing circuit 1005, the A/D converter 1006, and the signal processing unit 1007 are controlled by a timing generator 1008. The entire system is controlled by a general control/arithmetic unit 1009. To record an image on a recording medium 1012, the output digital signal is recorded via a recording medium control I/F unit 1011 controlled by the general control/arithmetic unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2010-256318, filed Nov. 16, 2010 and 2011-219565, filed Oct. 3, 2011, which are hereby incorporated by reference herein in their entirety.

What is claimed is:

1. A solid-state image sensor comprising a pixel region and peripheral circuit region arranged on a semiconductor substrate, the pixel region including pixels each including a photoelectric conversion element and an amplification MOS transistor that outputs a signal corresponding to charges of the photoelectric conversion element to a column signal line, the peripheral circuit region including a circuit that drives the pixel or processes the signal output to the column signal line, wherein a resistance of a source region of the amplification MOS transistor is lower than a resistance of a drain region of the amplification MOS transistor, wherein a contact area, in a plane parallel to a surface of the semiconductor substrate, between contact plugs connected to the source region of the amplification MOS transistor and the source region of the amplification MOS transistor is larger than a contact area in the plane between one or more contact plugs connected to the drain region of the amplification MOS transistor and the drain region of the amplification MOS transistor, wherein an interface in the plane between the source region and a channel region of the amplification MOS transistor is wider than an interface in the plane between the drain region and the channel region of the amplification MOS transistor, and wherein a number of contact plugs connected to the source region of the amplification MOS transistor is larger than a number of contact plugs connected to the drain region of the amplification MOS transistor.

2. The solid-state image sensor according to claim 1, wherein an impurity concentration of the source region of the amplification MOS transistor is higher than an impurity concentration of the drain region of the amplification MOS transistor.

3. The solid-state image sensor according to claim 1,
wherein a peripheral MOS transistor that constitutes part of the circuit is arranged in the peripheral circuit region,
wherein each of a source region and a drain region of the peripheral MOS transistor includes an intermediate region closer to a channel than the contact area, and a region closer to the channel than the intermediate region,
wherein an impurity concentration of the intermediate region is higher than an impurity concentration of the region closer to the channel than the intermediate region, and
wherein an impurity concentration of the source region and the drain region of the amplification MOS transistor is lower than the impurity concentration of the intermediate region.

4. The solid-state image sensor according to claim 1, further comprising a peripheral MOS transistor that constitutes part of the circuit is arranged in the peripheral circuit region,
wherein each of a source region and a drain region of the peripheral MOS transistor includes an intermediate region closer to a channel than the contact area, and a region closer to the channel than the intermediate region,
wherein an impurity concentration of the intermediate region is higher than an impurity concentration of the region closer to the channel than the intermediate region, and
wherein an impurity concentration of the drain region of the amplification MOS transistor is lower than the impurity concentration of the intermediate region.

5. An imaging system comprising:
a solid-state image sensor defined in claim 1;
an optical system configured to form an image of light on said solid-state image sensor; and
a signal processing circuit configured to process an output signal from the solid-state image sensor.

6. The solid-state image sensor according to claim 1, wherein a contact area in the plane between a contact plug connected to a source region of a peripheral MOS transistor and the source region of the peripheral MOS transistor is equal to a contact area in the plane between another contact plug connected to a drain region of the peripheral MOS transistor and the drain region of the peripheral MOS transistor.

7. A solid-state image sensor comprising a pixel region and peripheral circuit region arranged on a semiconductor substrate, the pixel region including pixels each including a photoelectric conversion element and an amplification MOS transistor that outputs a signal corresponding to charges of the photoelectric conversion element to a column signal line, the peripheral circuit region including a circuit that drives the pixel or processes the signal output to the column signal line,
wherein an interface, in a plane parallel to a surface of the semiconductor substrate, between a source region and a channel region of the amplification MOS transistor is wider than an interface in the plane between a drain region and the channel region of the amplification MOS transistor,
wherein a contact area, in the plane between contact plugs connected to the source region of the amplification MOS transistor and the source region of the amplification MOS transistor is larger than a contact area in the plane between one or more contact plugs connected to the drain region of the amplification MOS transistor and the drain region of the amplification MOS transistor, and
wherein a number of contact plugs connected to the source region of the amplification MOS transistor is larger than a number of contact plugs connected to the drain region of the amplification MOS transistor.

8. The solid-state image sensor according to claim 7, wherein impurity concentration of the source region of the amplification MOS transistor is higher than an impurity concentration of the drain region of the amplification MOS transistor.

9. The solid-state image sensor according to claim 7,
wherein a peripheral MOS transistor that constitutes part of the circuit is arranged in the peripheral circuit region,
wherein each of a source region and a drain region of the peripheral MOS transistor includes an intermediate region closer to a channel than the contact area, and a region closer to the channel than the intermediate region,
wherein an impurity concentration of the intermediate region is higher than an impurity concentration of the region closer to the channel than the intermediate region, and
wherein an impurity concentration of the source region and the drain region of the amplification MOS transistor is lower than the impurity concentration of the intermediate region.

10. The solid-state image sensor according to claim 7, further comprising a peripheral MOS transistor that constitutes part of the circuit is arranged in the peripheral circuit region,
wherein each of a source region and a drain region of the peripheral MOS transistor includes an intermediate region closer to a channel than the contact area, and a region closer to the channel than the intermediate region,
wherein an impurity concentration of the intermediate region is higher than an impurity concentration of the region closer to the channel than the intermediate region, and
wherein an impurity concentration of the drain region of the amplification MOS transistor is lower than the impurity concentration of the intermediate region.

* * * * *